United States Patent
Choung et al.

(10) Patent No.: US 7,776,633 B2
(45) Date of Patent: Aug. 17, 2010

(54) THIN FILM TRANSISTOR ARRAY PANEL AND METHOD OF MANUFACTURE

(75) Inventors: Jong-Hyun Choung, Suwon-si (KR); Hong-Sick Park, Suwon-si (KR); Joo-Ae Yoon, Seongnam-si (KR); Jeong-Min Park, Seoul (KR); Doo-Hee Jung, Seoul (KR); Sun-Young Hong, Seoul (KR); Bong-Kyun Kim, Incheon-si (KR); Won-Suk Shin, Yongin-si (KR); Byeong-Jin Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 523 days.

(21) Appl. No.: 11/696,097

(22) Filed: Apr. 3, 2007

(65) Prior Publication Data
US 2008/0067603 A1 Mar. 20, 2008

(30) Foreign Application Priority Data
Sep. 15, 2006 (KR) ...................... 10-2006-0089453

(51) Int. Cl.
*H01L 21/00* (2006.01)
(52) U.S. Cl. .................... 438/30; 438/149; 438/158; 257/E21.414
(58) Field of Classification Search .................. 438/149, 438/30, 158, 151; 257/E21.414
See application file for complete search history.

(56) References Cited
U.S. PATENT DOCUMENTS
6,828,167 B2 12/2004 Kim
(Continued)

FOREIGN PATENT DOCUMENTS
JP 2002-110631 4/2002
(Continued)

OTHER PUBLICATIONS
English Language Abstract, KR Patent First Publication No. 1020050038850, Apr. 29, 2005, 1 page, relating to KR 10-0561646, Mar. 9, 2006.
(Continued)

*Primary Examiner*—Michael Trinh
(74) *Attorney, Agent, or Firm*—Innovation Counsel LLP

(57) ABSTRACT

A method of manufacturing a thin film transistor array panel, including: forming gate lines on a substrate; forming a gate insulating layer on the gate lines; forming semiconductor layers on the gate insulating layer; forming data lines and drain electrodes on the semiconductor layers; depositing a passivation layer on the data lines and the drain electrodes; forming a first photoresist layer including a first portion and a second portion that is thinner than the first portion on the passivation layer; forming a first preliminary contact hole exposing the data lines by etching the passivation layer by using the first photoresist layer as a mask; removing the second portion of the first photoresist; forming a first contact hole by expanding the first preliminary contact hole and opening portions by etching the passivation layer by using the first portion of the first photoresist layer as a mask; depositing a conductor layer; and forming pixel electrodes in the opening portions and a first contact assistant member in the first contact hole by removing the first photoresist layer and the conductor layer located thereon.

14 Claims, 15 Drawing Sheets

U.S. PATENT DOCUMENTS

| | | | |
|---|---|---|---|
| 7,435,629 B2 * | 10/2008 | Youn | 438/149 |
| 2004/0126916 A1 | 7/2004 | Song et al. | |
| 2005/0263768 A1 * | 12/2005 | Ahn | 257/72 |

FOREIGN PATENT DOCUMENTS

| | | |
|---|---|---|
| JP | 2003-234480 | 8/2003 |
| KR | 1020010019668 | 3/2001 |
| KR | 10-0372306 | 2/2003 |
| KR | 1020030064975 | 8/2003 |
| KR | 1020040021394 | 3/2004 |
| KR | 1020050110369 | 11/2005 |
| KR | 10-0561646 | 3/2006 |

OTHER PUBLICATIONS

English Language Abstract, KR Patent First Publication No. 1020000033047, Jun. 15, 2000, 1 page, relating to KR 10-0372306, Feb. 3, 2003.

* cited by examiner

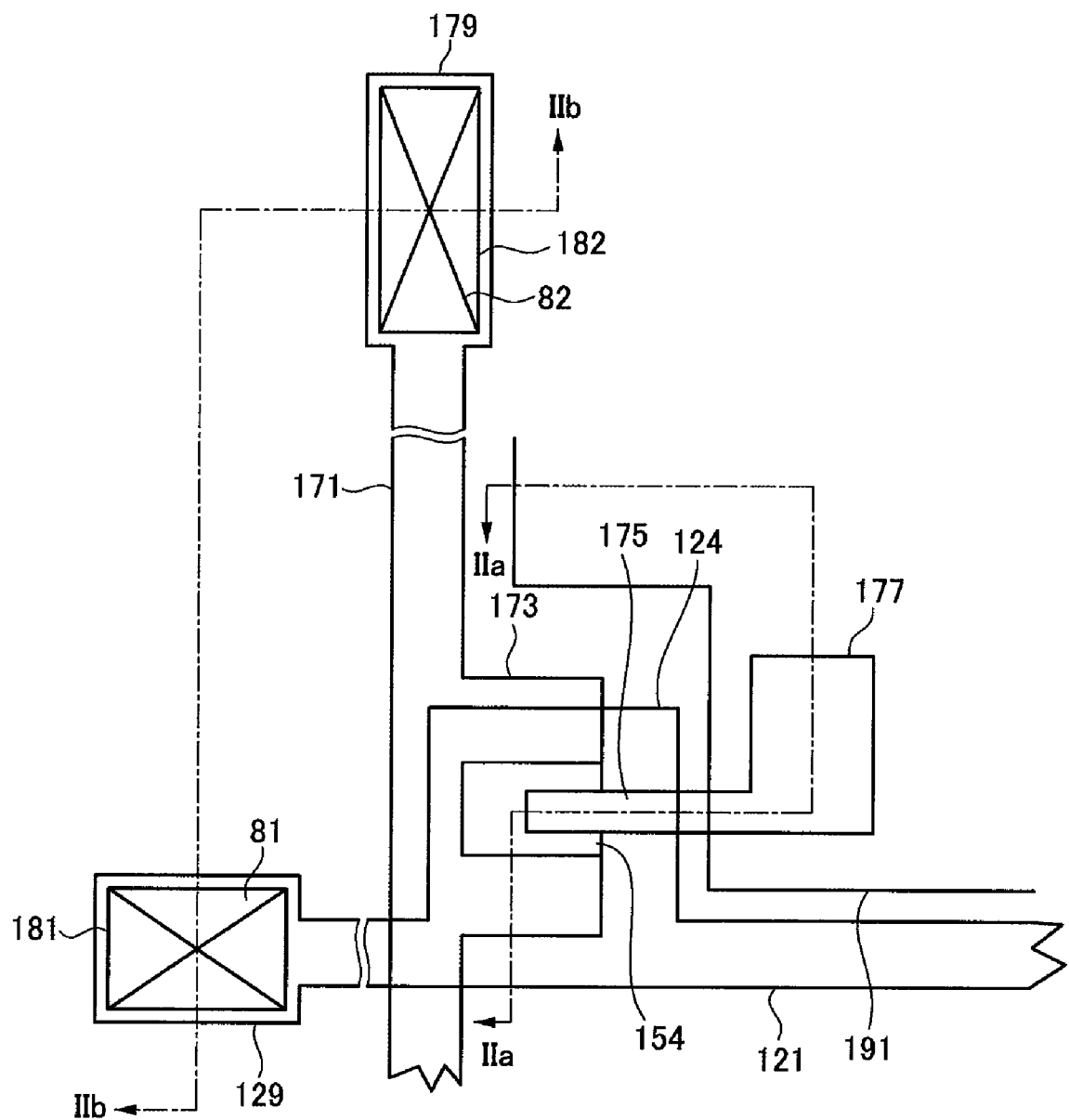

THIN FILM TRANSISTOR ARRAY PANEL AND METHOD OF MANUFACTURE

CROSS-REFERENCE TO RELATED APPLICATION

This application claims priority to and the benefit of Korean Patent Application No. 10-2006-0089453 filed in the Korean Intellectual Property Office on Sep. 15, 2006, the entire contents of which are incorporated herein by reference.

BACKGROUND OF THE INVENTION

1. Field of the Invention

The present invention relates to a thin film transistor array panel and a method of manufacturing the same.

2. Description of the Related Art

A thin film transistor (TFT) array panel is used as a circuit board for independently driving each pixel in a liquid crystal display or an organic light emitting diode display (OLED). The thin film transistor array panel includes, for example, gate lines that transmit gate signals, data lines that transmit data signals, thin film transistors that are connected to the gate lines and the data lines, and pixel electrodes that are connected to the thin film transistors.

The thin film transistors are switching elements that control the data signals transmitted to the pixel electrodes through the data lines according to the gate signals transmitted through the gate lines. In addition, the thin film transistors include gate electrodes connected to the gate lines, semiconductor layers forming channels, source electrodes connected to the data lines, and drain electrodes facing source electrodes with respect to the semiconductor layer.

However, several photolithography processes are required to manufacture the thin film transistor array panel. Since each photolithography process has complicated sub-processes, the required time and cost for manufacturing the thin film transistor array panel are influenced by the number of photolithography processes.

One of the photolithography processes can be eliminated by simultaneously forming the connection structure of the drain electrodes and the pixel electrodes, the pixel electrodes, contact holes for connecting the gate lines and the drain electrodes to external driving circuits, and contact preliminary members.

When such thin film transistor is manufactured, a contact hole and an opening portion are formed by forming a passivation layer on the data lines and the drain electrodes, forming a photoresist layer on the passivation layer and etching the passivation layer by using the photoresist layer as a mask. A transparent conductor layer may be deposited without the removal of the photoresist layer. However, if the photoresist layer is removed, the photoresist layer and the transparent conductor layer disposed on the photoresist layer are simultaneously removed. Then, the remaining transparent conductor layer becomes a contact assistant member and a pixel electrode.

In the above-described lift-off method, when the contact holes and the opening portions are formed on the passivation layer, since the data lines and the drain electrodes exposed through the contact holes and the opening portions are simultaneously etched, short circuits and poor contacts may occur. Accordingly, a photoresist layer having a gentle inclination is required so as to form the contact hole and opening portion. However, it is difficult to completely remove the photoresist layer without leaving a residue.

SUMMARY OF THE INVENTION

According to an aspect of the present invention, there is provided a method of manufacturing a thin film transistor array panel, including: forming gate lines including pads for connections to another layer or an external device on a substrate; forming a gate insulating layer on the gate lines; forming semiconductor layers on the gate insulating layer; forming data lines including pads for connections to another layer or an external device, and drain electrodes on the semiconductor layers; depositing a passivation layer on the data lines and the drain electrodes; forming a first photoresist layer including a first portion and a second portion that is thinner than the first portion on the passivation layer; forming a first preliminary contact hole exposing the data lines by etching the passivation layer by using the first photoresist layer as a mask; removing the second (thinner) portion of the first photoresist; forming a first contact hole by expanding the first preliminary contact hole and opening portions by etching the passivation layer by using the first portion of the first photoresist layer as a mask; depositing a conductor layer; and forming pixel electrodes in the opening portions and a first contact assistant member in the first contact hole by removing the first photoresist layer and the conductor layer located thereon.

According to another aspect of the invention, a second preliminary contact hole, exposing a part of the gate lines, may be formed by etching the passivation layer and the gate insulating layers using the first photoresist layer as a mask concurrently with the forming of the first preliminary contact hole.

Further, the forming of a second contact hole by expanding the second preliminary contact hole by etching the passivation layer and the gate insulating layer by using the first portion of the first photoresist layer as a mask may be carried out together with the forming of the first contact hole.

Additionally, the forming of the second contact assistant member in the second contact hole may be carried out together with the forming of the first contact assistant member.

The forming of the first photoresist layer, including the first portion and the second portion, may use a photomask including a light blocking area, a slit-shaped translucent area, and a light transmitting area.

The second (thinner) portion of the first photoresist layer may be formed so as to face the slit-shaped translucent area.

The second (thinner) portion of the first photoresist layer may be formed on a part of the pads of the data lines.

The second (thinner) portion of the first photoresist layer may be formed on a part of the pads of the gate lines.

The first preliminary contact hole may be expanded toward any one of the directions in the forming of the first contact hole by expanding expands the first preliminary contact hole and the opening portion.

The second preliminary contact hole may be expanded toward any one of the directions in the forming of the second contact hole by expanding the second preliminary contact hole.

The ratio of the second portion of the first photoresist layer formed on a part of the pads of the gate lines and the pads of the data lines to the portion not having the first photoresist layer formed on the pads of the gate lines and the pads of the data lines may be in the range of 1-10: 1-10.

The removing of the second portion of the first photoresist layer may include an ashing process.

The pixel electrodes may be formed of a transparent conductive material such as IZO or ITO.

The forming of the semiconductor layers, the data lines, and the drain electrodes may include: sequentially depositing a gate insulating layer, an intrinsic amorphous silicon layer, an impurity amorphous silicon layer, and a data conductive layer on the gate lines; forming the second photoresist layer having a different thickness based on the locations thereof on the data conductive layer; and forming the semiconductor layers, the data lines, and the drain electrodes by selectively etching the data conductive layer, the impurity amorphous silicon layer, and the intrinsic amorphous silicon layer by using the second photoresist layer as a mask.

According to another aspect of the present invention, there is provided a thin film transistor array panel including: a substrate; gate lines that are formed on the substrate and include pads provided so as to be connected to another layer or an external device; a gate insulating layer formed on the gate lines; semiconductor layers formed on the gate insulating layer; data lines including pads provided so as to be connected to another layer or an external device and drain electrodes that are formed on the semiconductor layers; a passivation layer formed on the gate insulating layer, the data lines, and a first portion of the drain electrodes; and pixel electrodes formed on a second portion of the drain electrodes. In this configuration, the plane shape of the semiconductor layers, the data lines, and the drain electrodes may be substantially to the same as each other, except for the spaces between the data lines and the drain electrodes, and the thickness of the pads of the data lines may be non-uniform.

The thin film transistor may further include ohmic contact layers formed between the semiconductor layers and the data lines and between the semiconductor layers and the drain electrodes.

Ohmic contact members may be formed on the pads of the data lines.

Ohmic contact members may be formed on the pads of the gate lines.

The pixel electrodes and/or the contact assistant members may be formed of a transparent conductive material such as IZO or ITO.

BRIEF DESCRIPTION OF THE DRAWINGS

FIG. 1 is a layout view of a thin film transistor array panel according to an embodiment of the present invention.

DETAILED DESCRIPTION OF THE EMBODIMENTS

Figure 2A:
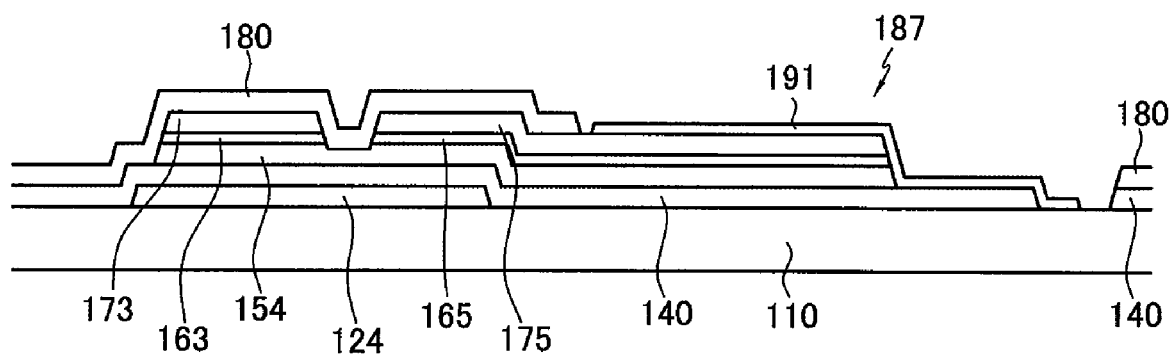
FIG. 2A and FIG. 2B are cross-sectional views taken along lines IIa-IIa and IIb-IIb of FIG. 1, respectively.

An exemplary embodiment of the invention provides a simplified method of manufacturing a thin film transistor array panel that reduces problems caused by remnants of a photoresist layer and that prevents damage to the pads of gate lines and data lines.

In the drawings, the thickness of layers and regions are enlarged for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The thin film transistor array panel according to the embodiment of the invention will be described more fully with reference to FIG. 1 to FIG. 2B.

FIG. 1 is a layout view of a thin film transistor array panel for a liquid crystal display according to an embodiment of the invention. FIG. 2A is cross-sectional view taken along line IIa-IIa of FIG. 1, and FIG. 2B is cross-sectional view taken along line IIb-IIb of FIG. 1.

A plurality of gate lines 121 are formed on an insulating substrate 110 formed of, for example, a transparent glass or plastic.

The gate lines 121 transmit gate signals and substantially extend in the transverse direction. Each gate line 121 includes a plurality of gate electrodes 124 protruding upwardly and a wide pad 129 provided for connection to another layer or an external driving circuit. A gate driving circuit (not shown) for generating the gate signals may be mounted on a flexible printed circuit film (not shown) that is attached to the substrate 110. Alternatively, the gate driving circuit may be directly mounted on the substrate 110, or may be integrated with the substrate 110. When the gate driving circuit is integrated with the substrate 110, the gate lines 121 are extended and may be directly connected thereto.

The gate lines 121 are formed of, for example, an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), or titanium (Ti). However, the gate lines 121 may have a multi-layered structure including two conductive layers (not shown) in which physical characteristics are different to each other. One of the two conductive layers is made of a metal having low resistivity, such as an Al-based metal, an Ag-based metal, or a Cu-based metal in order to reduce signal delay or voltage drop. On the other hand, the other conductive layer is made of a material such as a Mo-based metal, Cr, Ta, or Ti, which has good physical, chemical, and electrical contact characteristics with materials such as indium tin oxide (ITO) and indium zinc oxide (IZO). Examples of the two conductive layers may include the combination of a lower layer of Cr with an upper layer of Al (alloy), and the combination of a lower layer of Al (alloy) with an upper layer of Mo (alloy). However, the gate lines 121 may be made of various metals or conductors.

The lateral sides of the gate lines 121 are preferably inclined at an angle between about 30 and about 80 degrees relative to the surface of the substrate 110.

A gate insulating layer 140 made of a silicon nitride (SiNx) or silicon oxide (SiOx) is formed on the gate lines 121.

A plurality of linear semiconductor layers 151 made of hydrogenated amorphous silicon (hereinafter, the amorphous silicon is referred to as "a-Si"), polysilicon or the like are formed on the gate insulating layer 140. The linear semiconductor layers 151 substantially extend in a vertical direction and include a plurality of projections 154 extending toward the gate electrodes 124.

A plurality of linear-shaped and island-shaped ohmic contact members 161 and 165 are formed on the semiconductor layers 151. The ohmic contact members 161 and 165 may be formed of n+ hydrogenated a-Si in which an n-type impurity such as P is doped with a high density, or of silicide. The linear ohmic contact member 161 has a plurality of projections 163, and each projection 163 is paired with an island-shaped ohmic contact member 165. Each pair of a projection 163 and an island-shaped ohmic contact member 165 is disposed on a projection 154 of the semiconductor layer 151.

The lateral sides of the semiconductor layer 152 and the ohmic contact members 161 and 165 are also inclined at an angle between about 30 and about 80 degrees relative to the surface of the substrate 110.

A plurality of data lines 171 and a plurality of drain electrodes 175 are formed on the ohmic contact members 161 and 165.

The data lines 171 transmit the data voltages and extend in the vertical direction to intersect the gate lines 121. Each data line 171 includes a plurality of C-shaped source electrodes 173 extending toward the gate electrode 124 and a wide pad 179 provided so as to be connected to another layer or an external device. A data driving circuit (not shown) for generating the data signals may be mounted on the flexible printed circuit film (not shown) that is attached on the substrate 110. Alternatively, the data driving circuit may be directly mounted on the substrate 110, or may be integrated with the substrate 110. When the data driving circuit is integrated with the substrate 110, the data lines 171 are extended and may be directly connected thereto.

The drain electrodes 175 are separated from the data lines 171 and face the source electrodes 173 with respect to the gate electrodes 124. Each drain electrode 175 has one end as a wide surface or an extended portion 177 and the other end as a bar shape. A portion of the bar-shaped end is surrounded by the source electrode 173.

One thin film transistor (TFT) includes one gate electrode 124, one source electrode 173, one drain electrode 175, and the projection 154 of the semiconductor layer 151. The channel of the thin film transistor is formed at the projection 154 between the source electrode 173 and the drain electrode 175.

The data lines 171 and the drain electrodes 175 are preferably formed of a refractory metal, such as Mo, Cr, Ta, and Ti, or an alloy thereof. In addition, the data lines 171 and the drain electrodes 175 may have a multi-layered structure including a refractory metal layer (not shown) and a low resistance conductive layer (not shown). Examples of the multi-layered structure may include a two-layered structure having a lower layer of Cr or Mo (alloy) and an upper layer of Al (alloy), and a three-layered structure having a lower layer of Mo (alloy), an intermediate layer of Al (alloy), and an upper layer of Mo (alloy). However, the data lines 171 and the drain electrodes 175 may be made of various metals or conductors besides the above materials.

The lateral sides of the data lines 171 and the drain electrodes 175 are preferably inclined at an angle between about 30 and about 80 degrees relative to the surface of the substrate 110.

The ohmic contact members 161 and 165 are disposed only between the lower semiconductor layer 151 and the upper data lines 171, thus reducing contact resistance therebetween.

The planar shape of the linear semiconductor layer 151 is substantially the same as that of the data lines 171, the drain electrodes 175, and the ohmic contact members 161 and 165. However, the semiconductor layer 151 is exposed between the source electrodes 173 and the drain electrodes 175. In addition, the semiconductor layer 151 is exposed to the data lines 171 and the drain electrodes 175.

A passivation layer 180 is formed on the gate lines 121, the data lines 171, the exposed portions of the semiconductor layer 151, and a part of the drain electrodes 175. The passivation layer 180 may be made of an inorganic insulating material such as a silicon nitride and silicon oxide. Alternatively, the passivation layer 180 may be made of an organic insulating material having a dielectric constant of about 4.0 or less. The passivation layer 180 may have a two-layered structure comprising a lower inorganic layer and an upper organic layer such that the exposed portions of the semiconductor layer 151 are not damaged while maintaining the improved insulating characteristics of the organic layer.

The passivation layer 180 has a plurality of contact holes 182 for exposing a pad 179 of the data lines 171, and has a plurality of opening portions 187 that are located at the region surrounded by the gate lines 121 and the data lines 171. A part of the drain electrode 175 and the gate insulating layer 140 are exposed by the opening portions 187.

In addition, the passivation layer 180 and the gate insulating layer 140 have a plurality of contact holes 181 for exposing the pad 129 of the gate lines 121.

A plurality of pixel electrodes 191 are formed at the opening portions 187 of the passivation layer 180, and a plurality of contact assistant members 81 and 82 are formed in the contact holes 181 and 182. The pixel electrodes 191 and the contact assistant members 81 and 82 are made of a transparent conductive material, such as IZO or ITO, or a reflective metal, such as aluminum, silver, chromium, or alloy thereof.

The boundaries between the pixel electrodes 191 and the contact assistant members 81 and 82 substantially match with those of the passivation layer 180. More specifically, the boundaries of the pixel electrodes 191 substantially match those of the opening portions 187, and the boundaries of the contact assistant members 81 and 82 substantially match those of the contact holes 181 and 182.

The pixel electrodes 191 are directly contacted to the drain electrodes 175 exposed through the opening portions 187, and the data voltage is applied to the pixel electrodes 191 from the drain electrodes 175.

The pixel electrodes 191, to which the data voltage is applied, and a common electrode (not shown) of another array panel (not shown) to which a common voltage is applied, generate an electric field, thereby determining the direction of liquid crystal molecules in the liquid crystal layer (not shown) between the two electrodes. The polarization of the light transmitted through the liquid crystal layer is changed by the determined direction of the liquid crystal molecules. The pixel electrodes 191 and the common electrode form a capacitor (hereinafter referred to as a "liquid crystal capacitor") that maintains the applied voltage even after the thin film transistor is turned off.

The contact assistant members 81 and 82 are connected to the pad 129 of the gate lines 121 and the pad 179 of the data lines 171 through the contact holes 181 and 182, respectively. The contact assistant members 81 and 82 complement the adhesion of the pad 129 of the gate lines 121 and the pad 179 of the data lines 171 to the external devices, and also protect the pads.

A method of manufacturing the thin film transistor shown in FIG. 1 to FIG. 2B according to an embodiment of the invention will be described more fully with reference to FIG. 3 to FIG. 15B and FIG. 1 to FIG. 2B.

Figure 2B:
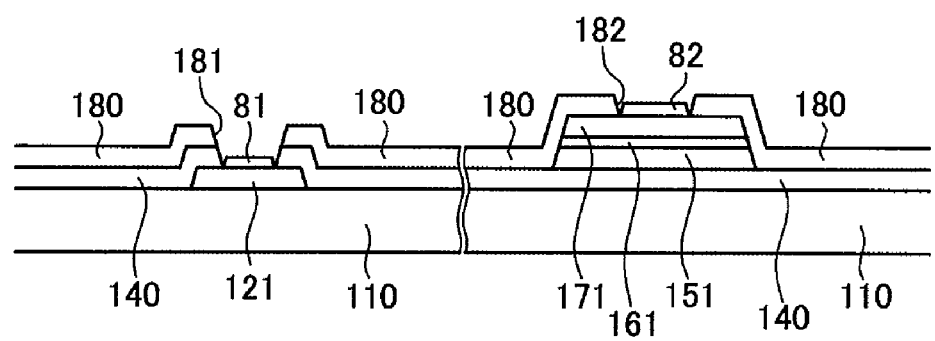
Figure 5A:
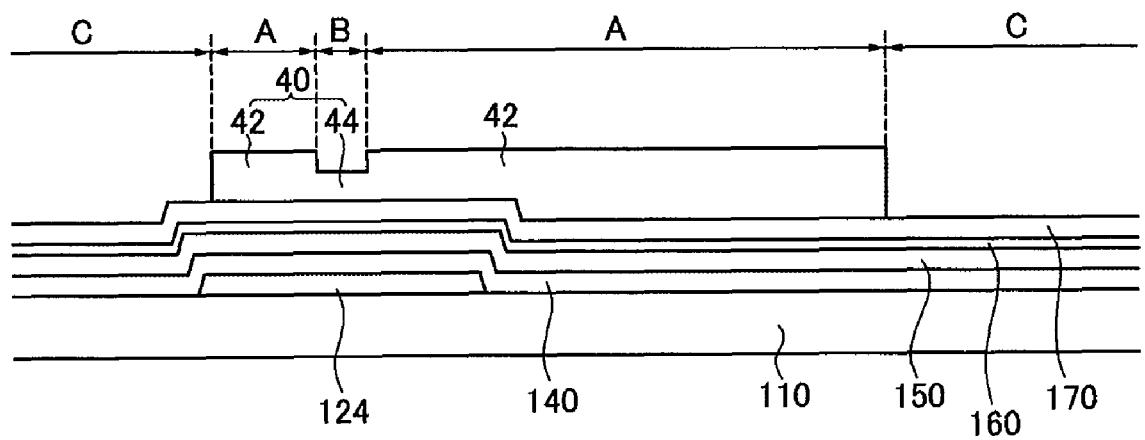
FIG. 5A and FIG. 5B are views subsequent to views shown in FIG. 4A and FIG. 4B, respectively.
Figure 5B:
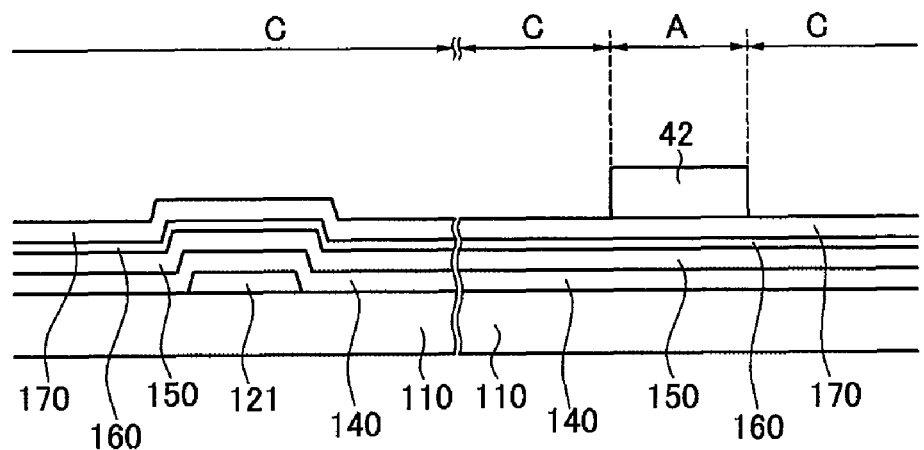
Figure 6:
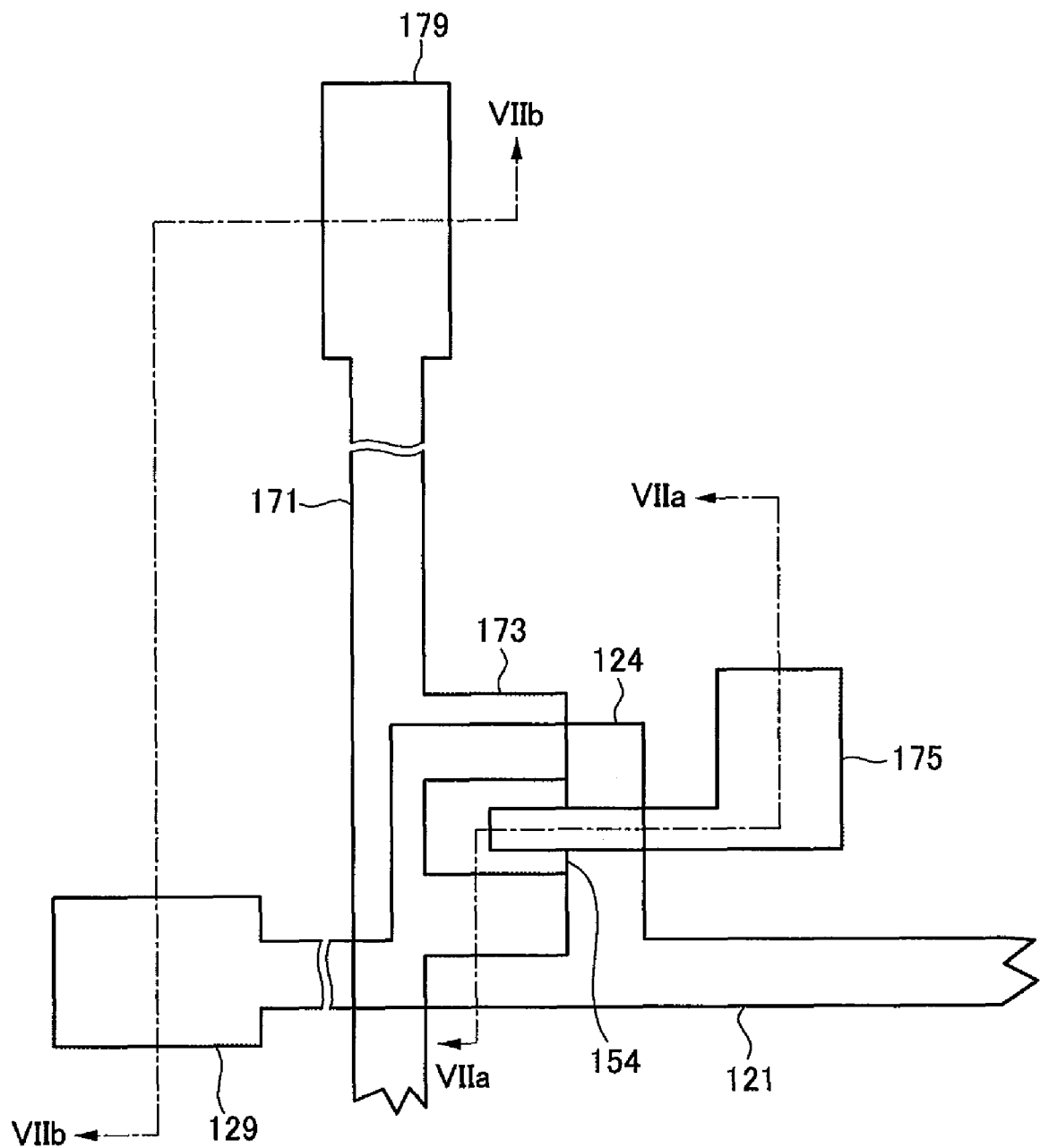
Figure 7A:
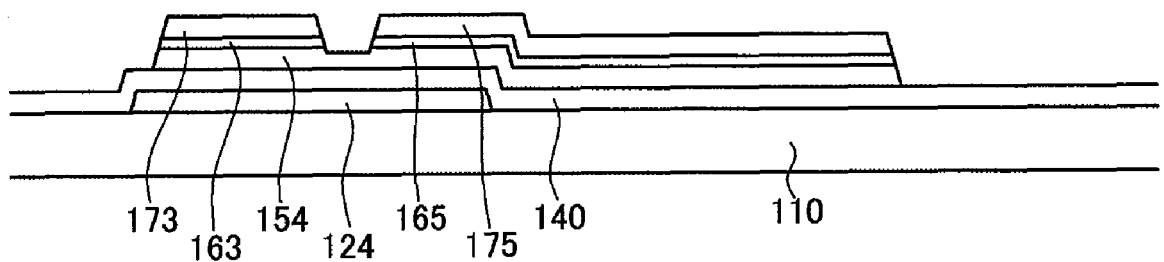
FIG. 7A and FIG. 7B are cross-sectional views taken along lines VIIa-VIIa and VIIb-VIIb of FIG. 6, respectively.
Figure 7B:
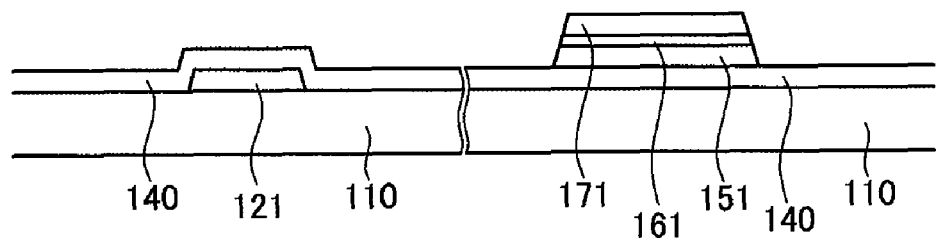
Figure 8A:
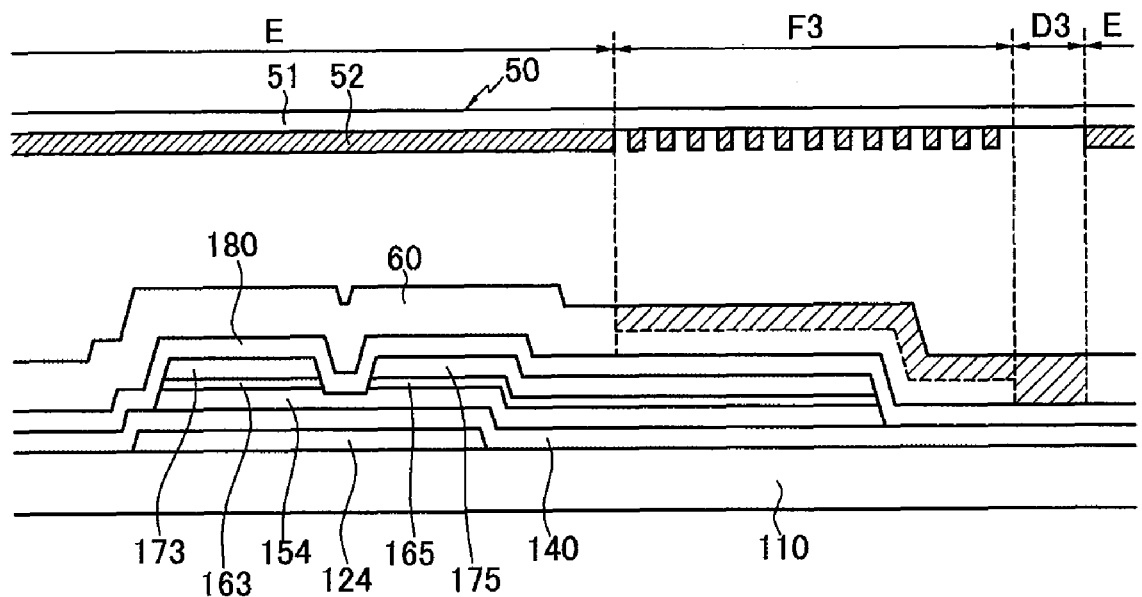
FIG. 8A and FIG. 8B are views subsequent to views shown in FIG. 7A and FIG. 7B, respectively.
Figure 8B:
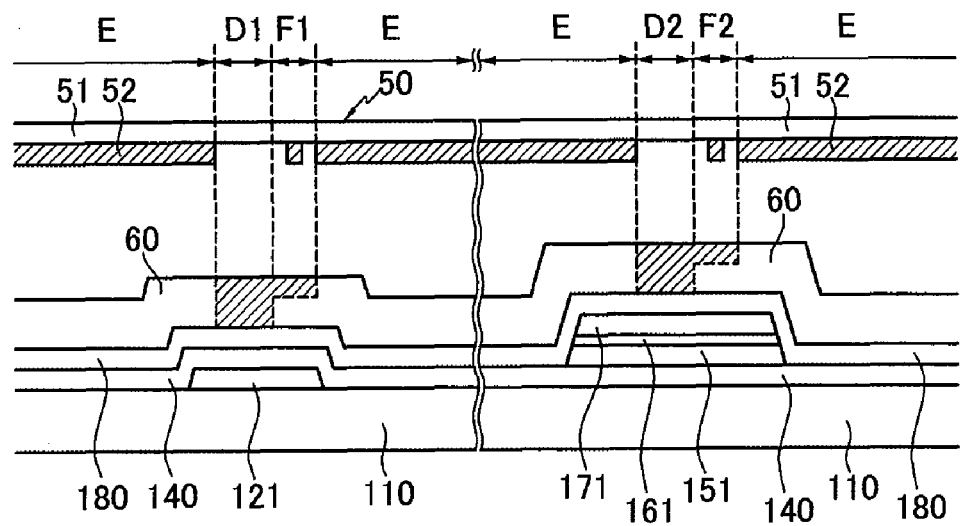
Figure 9A:
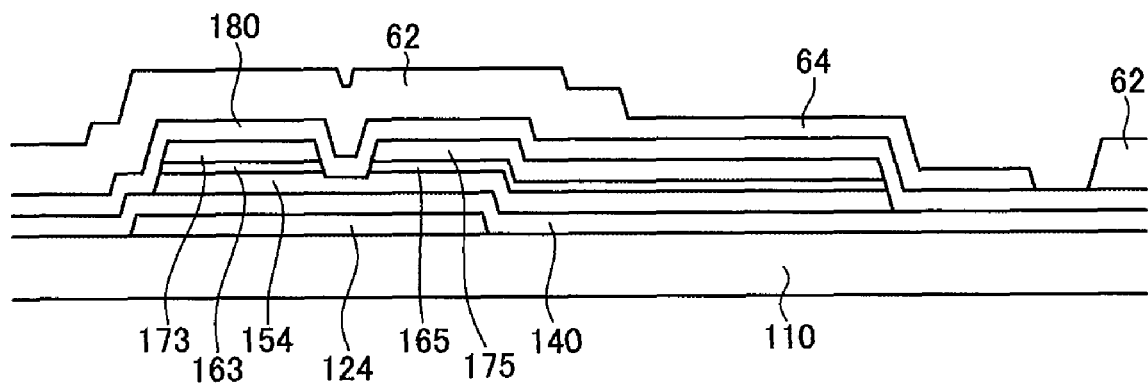
FIG. 9A and FIG. 9B are views subsequent to views shown in FIG. 8A and FIG. 8B, respectively.
Figure 9B:
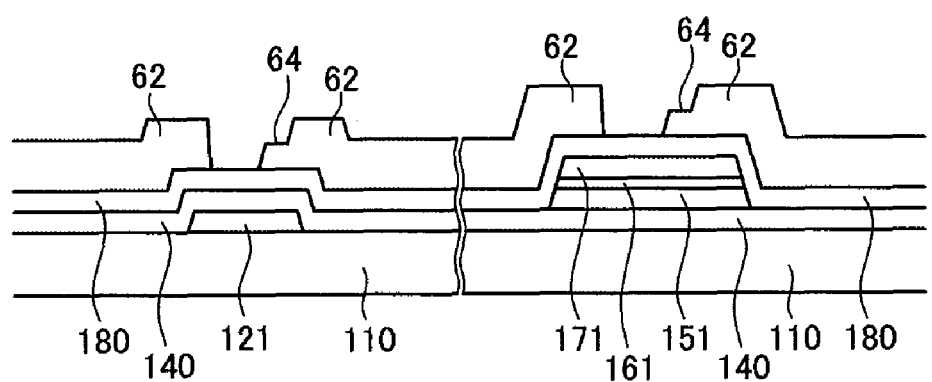
Figure 13A:
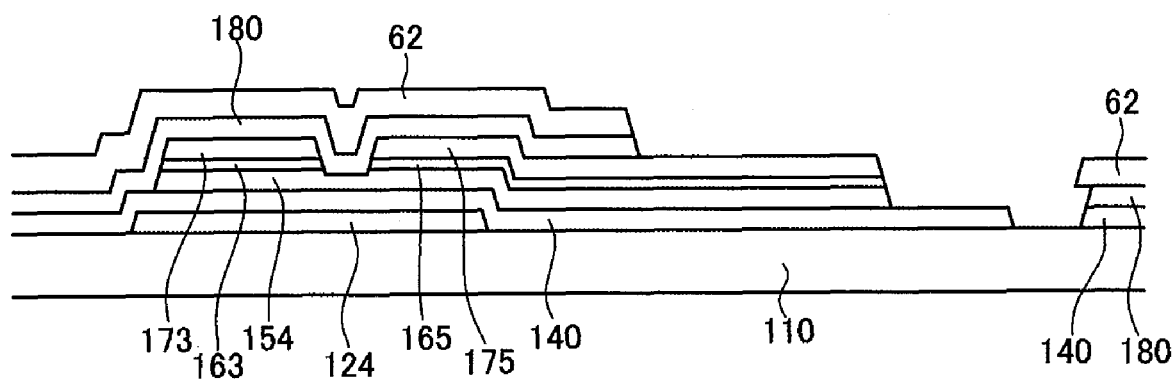
FIG. 13A and FIG. 13B are cross-sectional views taken along lines XIIa-XIIa and XIIb-XIIb of FIG. 12, respectively.
Figure 14:
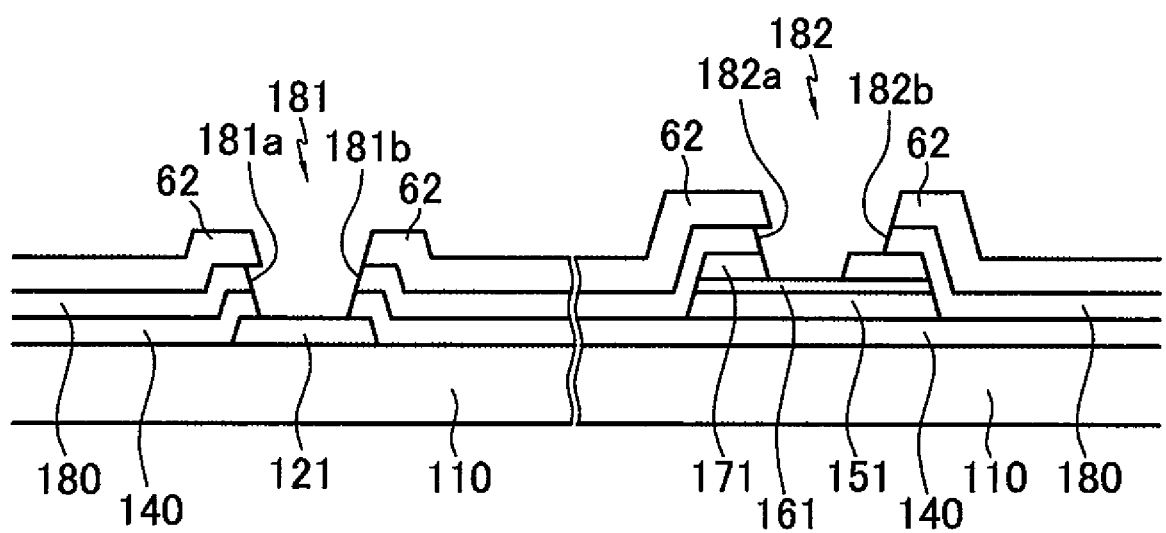
FIG. 14 is view showing another example of FIG. 13B.
Figure 15A:
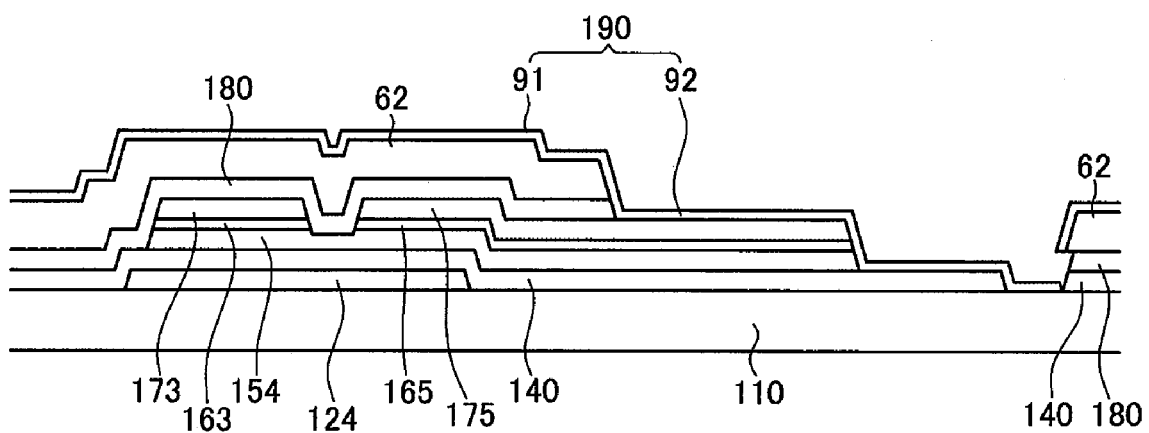
FIG. 15A and FIG. 15B are views subsequent to FIG. 13A and FIG. 13B, respectively.
Figure 15B:
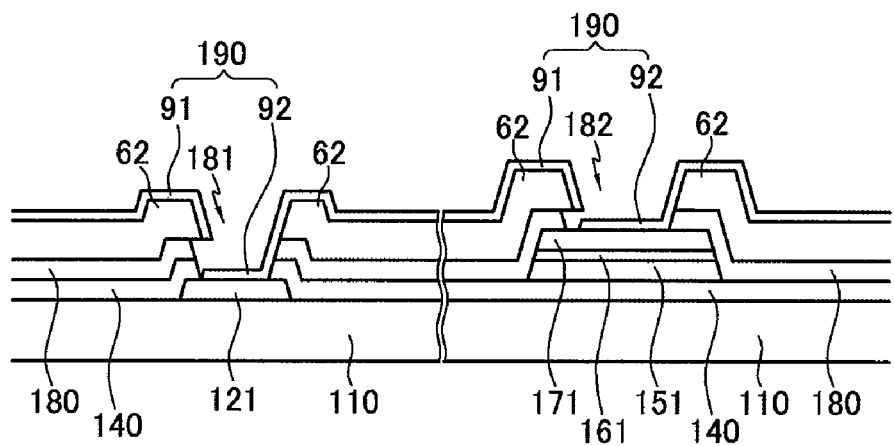

FIG. 3, FIG. 6, FIG. 10, and FIG. 12 are layout views of the thin film transistor array panel shown in FIG. 1 to FIG. 2B in intermediate steps of a method of manufacturing the thin film transistor array panel according to an embodiment of the invention, and are views showing the method of manufacturing the thin film transistor array panel in process order. FIG. 4A and FIG. 4B are cross-sectional views taken along lines IVa-IVa and IVb-IVb of FIG. 3, respectively, and FIG. 5A and FIG. 5B are views subsequent to those shown in FIG. 4A and FIG. 4B, respectively. FIG. 7A and FIG. 7B are cross-sectional views taken along lines VIIa-VIIa and VIIb-VIIb of FIG. 6, respectively, FIG. 8A and FIG. 8B are views subsequent to those shown in FIG. 7A and FIG. 7B, respectively, and FIG. 9A and FIG. 9B are views subsequent to those shown in FIG. 8A and FIG. 8B, respectively. FIG. 11A and FIG. 11B are cross-sectional views taken along lines XIa-XIa and XIb-XIb of FIG. 10, respectively. FIG. 13A and FIG. 13B are cross-sectional views taken along lines XIIa-XIIa and XIIb-XIIb of FIG. 12, respectively. FIG. 14 is view showing another example of FIG. 13B. FIG. 15A and FIG. 15B are views subsequent to those shown in FIG. 13A and FIG. 13B, respectively.

Figure 3:
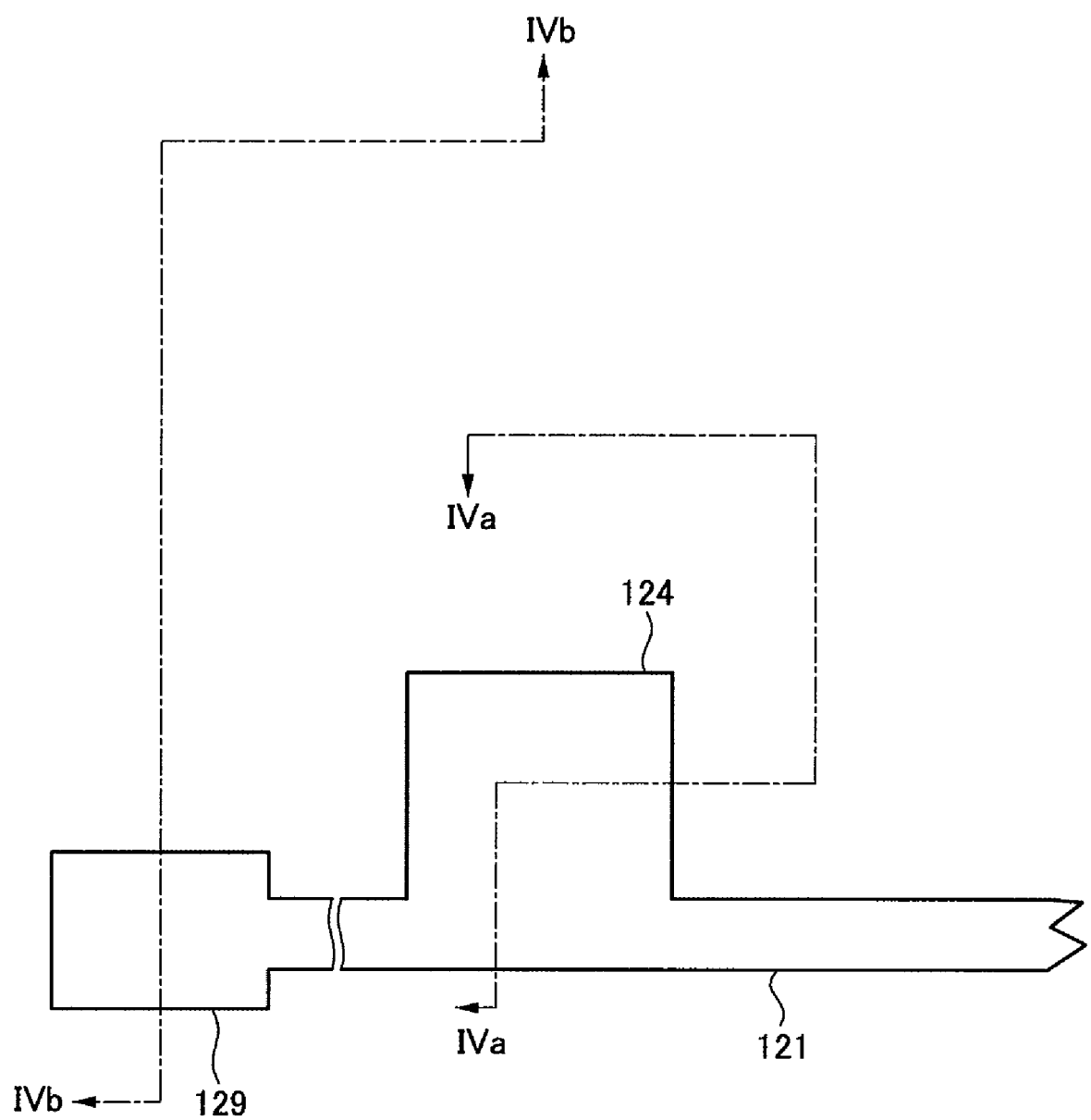
FIG. 3, FIG. 6, FIG. 10, and FIG. 12 are layout views of the thin film transistor array panel shown in FIG. 1 to FIG. 2B in intermediate steps of a method of manufacturing the thin film transistor array panel according to an embodiment of the invention, and views showing the method of manufacturing the thin film transistor array panel in process order.
Figure 4A:
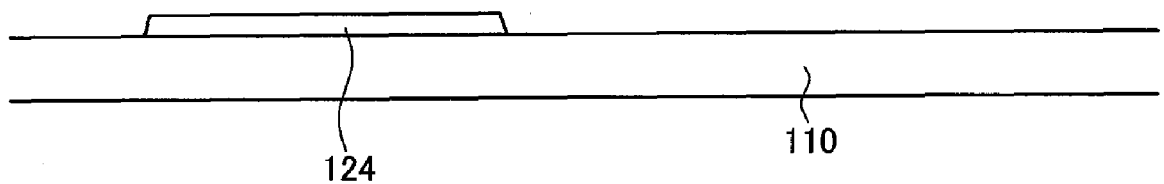
FIG. 4A and FIG. 4B are cross-sectional views taken along lines IVa-IVa and IVb-IVb of FIG. 3, respectively.
Figure 4B:
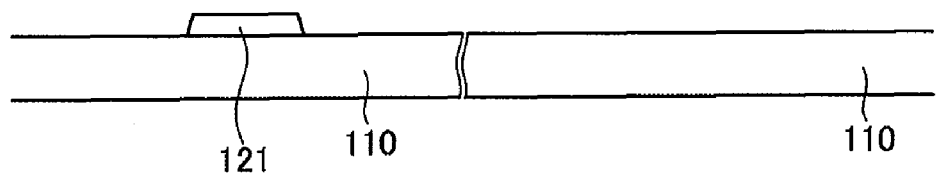

As shown in FIG. 3 to 4B, a metal layer is deposited on the insulating substrate 110 by, for example, a sputtering process, and a plurality of gate lines 121 including the gate electrodes 124 and the pads 129 are formed by a photolithography process.

Next, as shown in FIG. 5A and FIG. 5B, after the gate insulating layer 140, an intrinsic amorphous silicon layer 150, and an impurity amorphous silicon layer 160 are sequentially deposited by a chemical vapor deposition (CVD) process, a conductor layer 170 such as a metal is deposited on the impurity amorphous silicon layer 160 by a sputtering process. Then, a photoresist layer 40 having a thickness of about 1 μm to 2 μm is applied on the conductor layer 170, and the photoresist layer 40 is exposed and developed by using a photomask (not shown). The thickness of the developed photoresist layer 40 is varied by the locations thereof. In FIG. 5A and FIG. 5B, the photoresist layer 40 includes a plurality of first regions 42 and a plurality of second regions 44. The thickness of the second regions 42 is thinner than that of the first regions 42. The first areas 42 are located in the "A" area (hereinafter, referred to as the "wire area"), and the second areas 44 are located in the "B" area (hereinafter, referred to as the "channel area"). The photoresist layer 40 is not located in the "C" area (hereinafter, referred to as the "other area") separate from the wire area A and the channel area B.

As described above, the photoresist layer having different thicknesses at different locations is achieved by various methods. As an example of the methods, a translucent area in addition to a light transmitting area and a light blocking area may be provided in the exposed mask. A slit pattern, a lattice pattern, or a thin film having intermediate transmittance or intermediate thickness may be provided in the translucent area. When the slit pattern is used, it is preferable that the width of the slit or the interval between the slits be smaller than the resolution of the exposure device used in the photo process. As another example of the methods, a reflowable photoresist layer may be used. Namely, after the reflowable photoresist layer is formed by using a general mask having only the light transmitting area and the light blocking area, the thin photoresist layer is formed by allowing the photoresist layer to reflow into a region where the photoresist layer was not provided.

Under the appropriate process conditions, the lower layers may be selectively etched due to the thickness differences of the photoresist layer 40. Therefore, as shown in FIG. 6 to FIG. 7B, a plurality of data lines 171 including the source electrode 173 and the pad 179 and a plurality of drain electrodes 175 are formed by successive etching processes, and a plurality of linear-shaped ohmic contact members 161 and a plurality of island-shaped ohmic contact members 165 including a projection 163 and a plurality of linear-shaped linear semiconductor layers 151 including a projection 154 are formed.

For convenience, the conductor layer 170, the impurity amorphous silicon layer 160, and the intrinsic amorphous silicon layer 150 located in the wire area A region are defined as a first portion, the conductor layer 170, the impurity amorphous silicon layer 160, and the intrinsic amorphous silicon layer 150 located in the channel area B are defined as a second portion, and the conductor layer 170, the impurity amorphous silicon layer 160, and the intrinsic amorphous silicon layer 150 located in the other area C are defined as a third portion.

One exemplary sequence for forming the above structure is as follows.
(1) Remove the third portion of the conductor layer 170, the impurity amorphous silicon layer 160, and the intrinsic amorphous silicon layer 150 located in the other area C.
(2) Remove the second portion of the photoresist layer 40 film located in the channel area B.
(3) Remove the second portion of the conductor layer 170 and the impurity amorphous silicon layer 160 located in the channel area B.
(4) Remove the first portion of the photoresist layer 40 located in the wire area A.

Another exemplary sequence is as follows.
(1) Remove the third portion of the conductor layer 170 located in the other area C.
(2) Remove the second portion of the photoresist layer 40 located in the channel area B.
(3) Remove the third portion of the impurity amorphous silicon layer 160 and the intrinsic amorphous silicon layer 150 located in the other area C.
(4) Remove the second portion of the conductor layer 170 located in the channel area B.
(5) Remove the first portion of the photoresist layer 40 located in the wire area A.
(6) Remove the second portion of the impurity amorphous silicon layer 160 located in the channel area B.

When the second portion 44 of the photoresist layer 40 is removed, the thickness of the first portion 42 of the photoresist layer 40 is decreased. However, since the thickness of the second portion 44 of the photoresist layer 40 is thinner that that of the first portion 42 of the photoresist layer 40, the first portion 42, which prevents the lower layer from being removed or etched, is not fully removed.

If photoresist layer remains on the surface of the conductor layer 170, the remaining photoresist layer is removed by an ashing process.

Next, as shown in FIG. 8A and FIG. 8B, the passivation layer 180 is deposited on the data line 171 and the drain electrode 175, the photoresist layer 60 is applied on the passivation layer 180, and then the photomask 50 is aligned on the photoresist layer 60.

The photomask 50 includes a transparent substrate 51 and an opaque light blocking member 52 thereon. The photomask 50 is divided into light transmitting areas D1, D2, and D3, a light blocking area E, and translucent areas F1, F2, and F3 by the light blocking member 52. The light transmitting areas D1, D2, and D3 of a predetermined width or more do not have the light blocking member 52. In addition, the light blocking area E is covered by the light blocking member 52 having a predetermined width or more. Further, the translucent areas F1, F2, and F3 have the light blocking member 52, but the width and interval of the light blocking member 52 are of a predetermined value or less. Therefore, the translucent areas F1, F2, and F3 form a slit. The light transmitting area D3 may be replaced by the translucent area.

The light transmitting area D1 faces the pad 129 of the gate line 121, the light transmitting area D2 faces the pad 179 of the data line 171, and the light transmitting area D3 faces most area surrounded by the gate line 121, the data line 171 and the drain electrode 175. The translucent area F1 faces a part of the pad 129 of the gate line 121 and stands close to the light transmitting area D1. The translucent area F2 faces a part of the pad 179 of the data line 171 and stands close to the light transmitting area D2. The translucent area F3 is located on a part of the drain electrode 175 and stands close to the light transmitting area D3. The light blocking area E faces the rest of the part.

Here, the ratio of the light transmitting areas D1 and D2 to the translucent areas F1 and F2 is in the range of 1-10:1-10.

After light is irradiated onto the photoresist layer 60, if the photoresist layer 60 is developed by using the photomask 50. As a result of the development, as shown in FIG. 9A and FIG. 9B, the first portion 62 having a thick photoresist layer and the second portion 64 having a thin photoresist layer remain. The first portion 62 and the second portion 64 correspond to the rest of the part except for the slashed lines in FIG. 8A and FIG. 8B.

Figure 10:
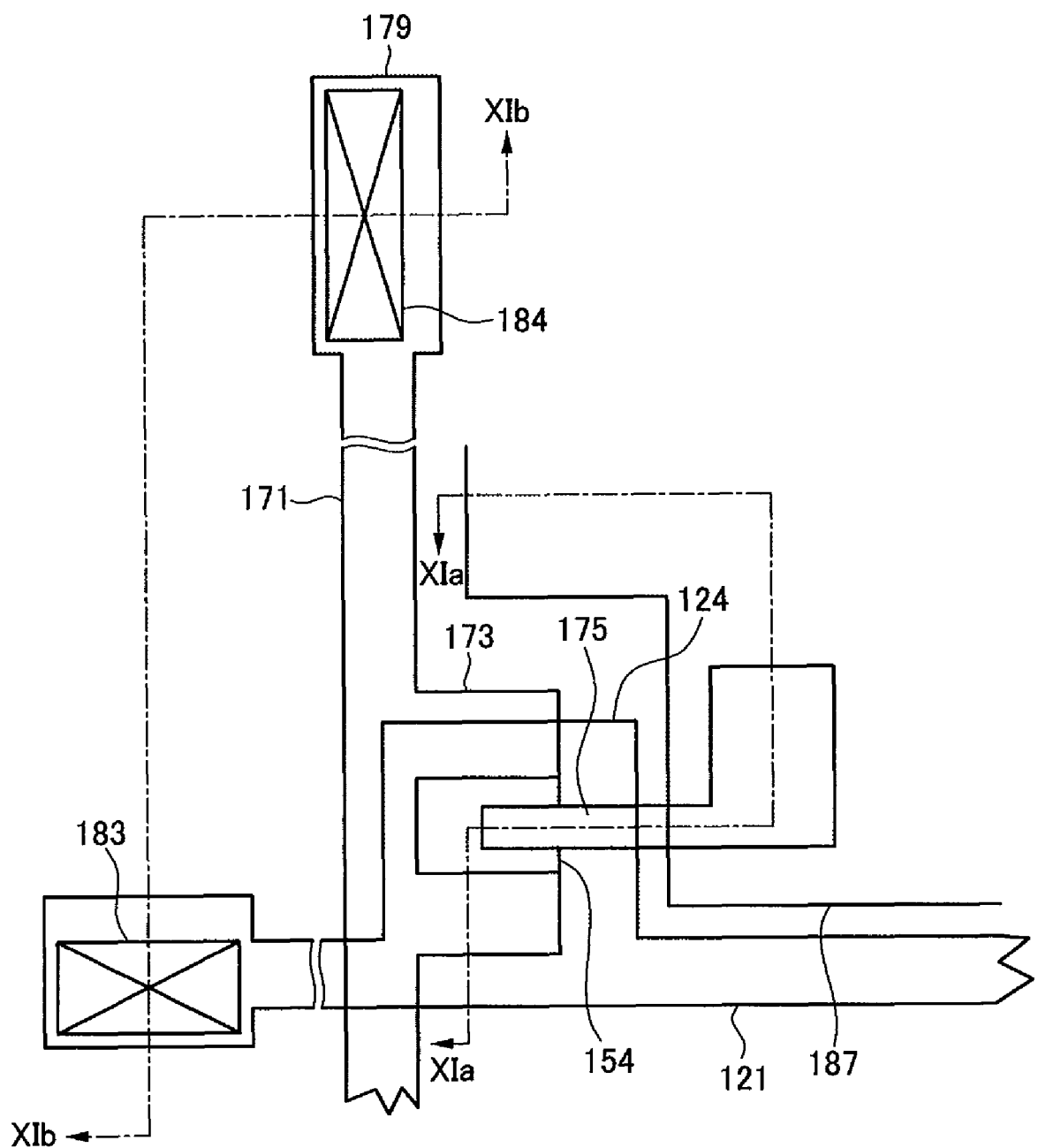
Figure 11A:
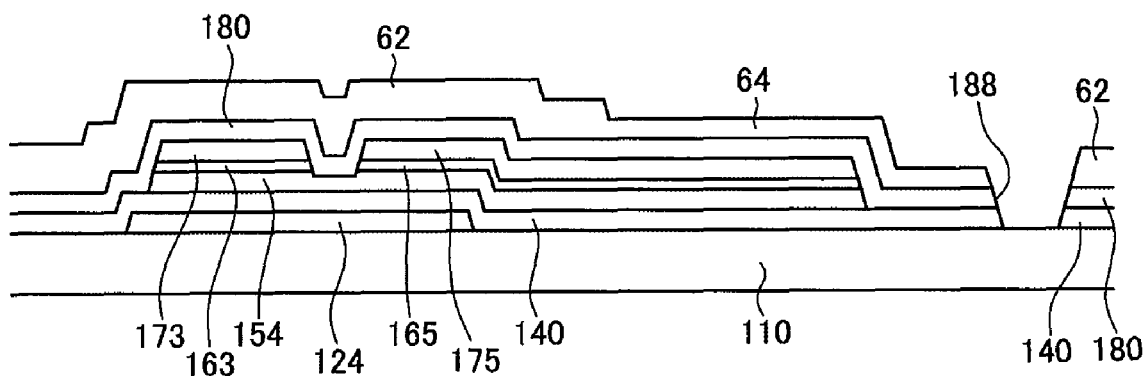
FIG. 11A and FIG. 11B are cross-sectional views taken along lines XIa-XIa and XIb-XIb of FIG. 10, respectively.
Figure 11B:
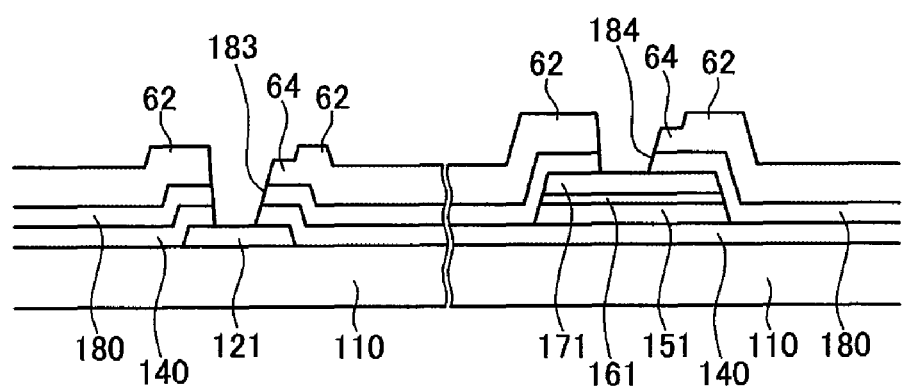

Next, as shown in FIG. 10 to FIG. 11B, a plurality of preliminary opening portions 188 for exposing the gate insulating layer 140, a plurality of preliminary contact holes 183 for exposing the pad 129 of the gate line 121, and a plurality of preliminary contact holes 184 for exposing the pad 179 of the data line 171 are formed by etching the passivation layer 180 and the gate insulating layer 140 by using the photoresist layer portions 62 and 64 as an etching mask.

Then, the second portion 64 of the photoresist layer is removed by an ashing process, thereby exposing the passivation layer 180. At this time, the thickness of the first portion 62 of the photoresist layer may become thinner.

Figure 12:
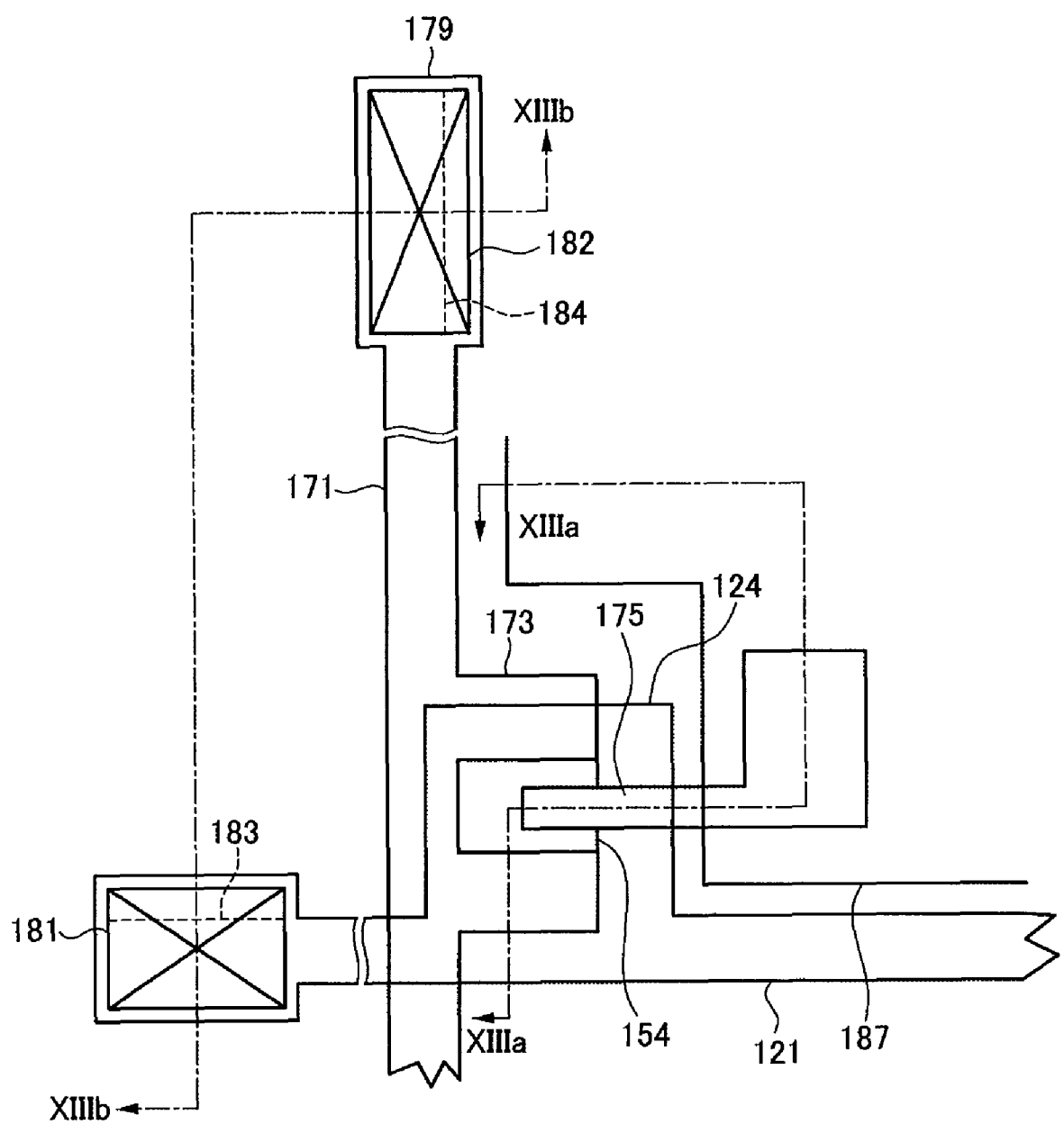
Figure 13B:
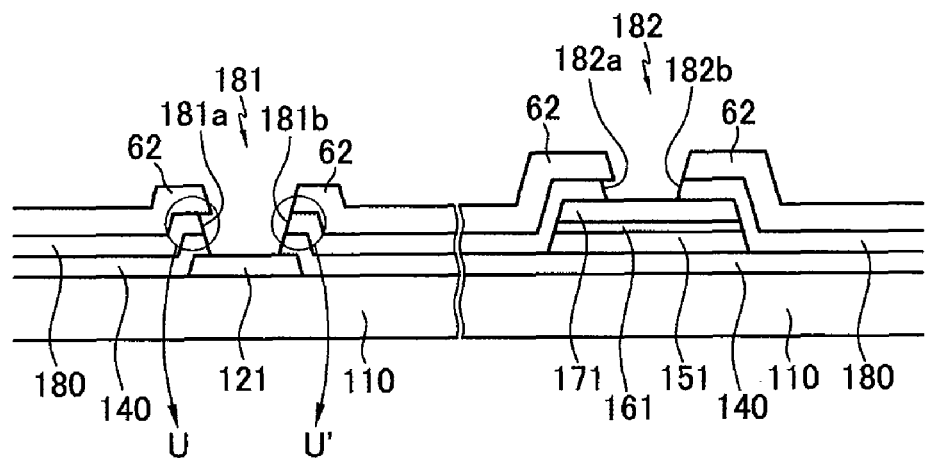

Next, as shown in FIG. 12 to FIG. 13B, the exposed passivation layer 180 and the gate insulating layer 140 are removed by again etching the passivation layer 180 and the gate insulating layer by using the remaining first portion 62 of the photoresist layer as an etching mask, and the opening portion 187 for exposing a part of the drain electrode 175 is formed by expanding the preliminary opening portion 188 while the contact holes 181 and 182 are formed by expanding the preliminary contact holes 183 and 184.

At this time, the gate insulating layer 140 and the passivation layer 180 are etched by using plasma etching having good isotropy instead of reaction ion etching having good anisotropy. For example, the better isotropy is achieved by using a gas mixture of $SF_6$ and $N_2$ rather than a gas mixture of $SF_6$ and $O_2$.

As described above, if etching conditions in which the isotropy is good are used, the extent of an undercut U increases in the boundary of the preliminary contact hole 183 substantially matches the boundary of the first portion 62 of the photoresist layer. Therefore the boundaries 181a and 182a of the contact holes 181 and 182 move downward from the first portion 62 of the photoresist layer. That is, since the extent of the etching in the lateral side of the gate insulating layer 140 and the passivation layer 180 increases, the boundaries 181a and 182a of the contact holes 181 and 182 move downward from the first portion 62 of the photoresist layer. However, since the passivation layer 180 is exposed outside the first portion 62 of the photoresist layer in the boundary of the preliminary contact hole 183 that does not completely match with the boundary of the first portion 62 of the photoresist layer, the exposed portion of the passivation layer 180 and the gate insulating layer 140 are removed in advance. Therefore, the extent of the undercut U' is relatively small in the boundaries 181b and 182b of the contact holes 181 and 182.

The pad 179 of the data line 171 or the pad 129 of the gate line 121 may be etched in the vicinity of the boundaries 181a and 182a of the contact holes 181 and 182. In the worst case, as shown in FIG. 14, the pad 179 of the data line 171 may be etched until the lower layer is exposed. However, even in this case, the upper portion of the pad 179 of the data line 171 naturally remains without completely being etched in the vicinity of the boundary 182b of the contact hole 182.

Next, as shown in FIG. 15A and FIG. 15B, a transparent conductor layer 190 is formed by depositing an IZO, ITO, or a-ITO layer through a sputtering process. At this time, the transparent conductor layer 190 includes a first portion 91 located on the first portion 62 of the photoresist layer and a second portion 92 located on the portion other than the first portion 62. The first portion 91 and the second portion 92 are separated at the portion of the boundary of the contact holes 181 and 182 in which the extent of the undercut U is excessive.

Next, when the substrate 110 is dipped into a solvent of the photoresist layer, the solvent permeates through the gap between the first portion 62 of the photoresist layer and the passivation layer 180, thereby removing the first portion 62 of the photoresist layer. At this time, since the solvent may easily permeate through the undercut U portion where the first portion 91 and the second portion 92 of the transparent conductor layer 190 are separated, the first portion 62 of the photoresist layer may be completely removed.

Since the first portion 91 of the transparent conductor layer 90 located on the first portion 62 of the photoresist layer is also removed together with the first portion 62 of the photoresist layer, only the second portion 92 of the transparent conductor layer 190 remains. The second portion 92 of the transparent conductor layer 190 forms the plurality of pixel electrodes 191 and the plurality of contact assistant members 81 and 82 (see FIG. 1, FIG. 2A, and FIG. 2B).

If the thin film transistor array panel is manufactured as described above, even when a part of the pad 179 of the data line 171 is removed, the rest of the pad 179 remains as shown in FIG. 14. Accordingly, the possibility of the poor contact is reduced.

As described above, according to the embodiments of the invention, it may by possible to remove the photoresist layer and reduce the poor contact by allowing the extent of the undercut below the photoresist layer to differ at the boundaries of the contact holes.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a thin film transistor array panel, comprising:
   forming gate lines including pads provided so as to be connected to another layer or an external device on a substrate;
   forming a gate insulating layer on the gate lines;
   forming semiconductor layers on the gate insulating layer;
   forming data lines including pads for connection to another layer or an external device, and drain electrodes on the semiconductor layers;
   depositing a passivation layer on the data lines and the drain electrodes;
   forming a first photoresist layer including a first portion and a second portion that is thinner than the first portion on the passivation layer;
   forming a first preliminary contact hole exposing the data lines by etching the passivation layer by using the first photoresist layer as a mask;
   removing the second portion of the first photoresist;
   forming a first contact hole by expanding the first preliminary contact hole and opening portions by etching the passivation layer by using the first portion of the first photoresist layer as a mask;
   depositing a conductor layer; and
   forming pixel electrodes in the opening portions and a first contact assistant member in the first contact hole by removing the first photoresist layer and the conductor layer located thereon.

2. The method of claim 1, wherein forming a second preliminary contact hole exposing a part of the gate lines by etching the passivation layer and the gate insulating layers by using the first photoresist layer as a mask is carried out together with the forming of the first preliminary contact hole.

3. The method of claim 2, wherein forming a second contact hole by expanding the second preliminary contact hole by etching the passivation layer and the gate insulating layer by using the first portion of the first photoresist layer as a mask is carried out together with the forming of the first contact hole.

4. The method of claim 3, wherein forming a second contact assistant member in the second contact hole is carried out together with the forming of the first contact assistant member.

5. The method of claim 3, wherein the second preliminary contact hole is expanded toward any one of the directions in the forming of the second contact hole by expanding the second preliminary contact hole.

6. The method of claim 5, wherein the ratio of the second portion of the first photoresist layer formed on a part of the pads of the gate lines and the pads of the data lines to the portion not having the first photoresist layer formed on the pads of the gate lines and the pads of the data lines is in the range of 1-10:1-10.

7. The method of claim 1, wherein the forming of the first photoresist layer including the first portion and the second portion uses a photomask including a light blocking area, a slit-shaped translucent area, and a light transmitting area.

8. The method of claim 7, wherein the second portion of the first photoresist layer is formed so as to face the slit-shaped translucent area.

9. The method of claim 8, wherein the second portion of the first photoresist layer is formed on a part of the pads of the data lines.

10. The method of claim 9, wherein the second portion of the first photoresist layer is formed on a part of the pads of the gate lines.

11. The method of claim 1, wherein the first preliminary contact hole is expanded toward any one of the directions in the forming of the first contact hole by expanding the first preliminary contact hole and the opening portion.

12. The method of claim 1, wherein the removing of the second portion of the first photoresist layer includes an ashing process.

13. The method of claim 1, wherein the pixel electrodes are formed of a transparent conductive material such as IZO or ITO.

14. The method of claim 1, wherein the forming of the semiconductor layers, the data lines, and the drain electrodes includes:
   sequentially depositing a gate insulating layer, an intrinsic amorphous silicon layer, an impurity amorphous silicon layer, and a data conductive layer on the gate lines;
   forming the second photoresist layer having a different thickness based on the locations thereof on the data conductive layer; and
   forming the semiconductor layers, the data lines, and the drain electrodes by selectively etching the data conductive layer, the impurity amorphous silicon layer, and the intrinsic amorphous silicon layer by using the second photoresist layer as a mask.

* * * * *